(12) United States Patent
Wang et al.

(10) Patent No.: US 12,250,520 B2
(45) Date of Patent: Mar. 11, 2025

(54) CAPACITIVE SENSOR ASSEMBLY AND ELECTRICAL CIRCUIT THEREFOR

(71) Applicant: Knowles Electronics, LLC, Itasca, IL (US)

(72) Inventors: Shenjie Wang, Olten (CH); René Scheuner, Gutenswil (CH); Mark Niederberger, Einsiedeln (CH)

(73) Assignee: Knowles Electronics, LLC, Itasca, IL (US)

( * ) Notice: Subject to any disclaimer, the term of this patent is extended or adjusted under 35 U.S.C. 154(b) by 308 days.

(21) Appl. No.: 18/092,285

(22) Filed: Dec. 31, 2022

(65) Prior Publication Data

US 2024/0223965 A1 Jul. 4, 2024

(51) Int. Cl.
*H04R 19/04* (2006.01)
*H03F 3/45* (2006.01)
*H04R 1/04* (2006.01)

(52) U.S. Cl.
CPC ......... *H04R 19/04* (2013.01); *H03F 3/45475* (2013.01); *H04R 1/04* (2013.01); *H03F 2200/165* (2013.01); *H04R 2201/003* (2013.01)

(58) Field of Classification Search
CPC ........... H03F 3/45475; H03F 2200/165; H04R 19/04; H04R 1/04; H04R 2201/003; H04R 19/005

See application file for complete search history.

(56) References Cited

U.S. PATENT DOCUMENTS

| | | | |
|---|---|---|---|
| 11,689,848 B2* | 6/2023 | Pedersen | H04R 19/005 |
| | | | 324/679 |
| 2010/0246859 A1* | 9/2010 | David | G05F 1/467 |
| | | | 381/123 |
| 2013/0195291 A1 | 8/2013 | Josefsson | |
| 2016/0277846 A1* | 9/2016 | Lee | H04R 19/04 |
| 2021/0144486 A1 | 5/2021 | Singh et al. | |

FOREIGN PATENT DOCUMENTS

CN 101854575 A 10/2010

* cited by examiner

*Primary Examiner* — Brian Ensey
(74) *Attorney, Agent, or Firm* — Hickman Becker Bingham Ledesma LLP; Matthew C. Loppnow

(57) ABSTRACT

A capacitive sensor assembly is disclosed, including a capacitive motor coupled to a charge pump circuit via a low pass filter, and a frontend amplifier circuit having an input coupled to the capacitive motor interface and an output coupled to an output of the electrical circuit. An injection current source (ICS) is coupled to the charge pump circuit output and configured to control voltage across a diode-based resistive element of the low pass filter during a transient startup phase of the charge pump circuit, wherein a settling time of the charge pump is reduced.

20 Claims, 5 Drawing Sheets

CAPACITIVE SENSOR ASSEMBLY AND ELECTRICAL CIRCUIT THEREFOR

FIELD OF THE DISCLOSURE

The present disclosure relates generally to sensor assemblies and more particularly to capacitive sensor assemblies having reduced settling time and improved long-term stability, and to electrical circuits for such sensor assemblies.

BACKGROUND

Microelectromechanical systems (MEMS) microphones and other sensors comprising a capacitive transduction element (also referred to herein as a "capacitive motor") require the application of a DC bias voltage to the capacitive motor. One such bias voltage source is multi-stage charge pump (CP) comprising an anti-parallel diode-C low pass filter (LPF) on its output to attenuate thermal noise, ripple and other artifacts. In audio and other applications, the LPF must have a low cutoff frequency, typically 1 Hz or less. But the resulting large RC equivalent time constant increases the settling time of the LPF and retards CP startup. Moreover, the resistance produced by anti-parallel diodes (fabricated on integrated circuits in lieu of bulky resistors) are subject to PVT variations that affect long-term stability of the system. One known approach to reduce settling time is to increase the clock frequency temporarily during startup to speed charging of the filter capacitor. Another approach is to step down the CP output voltage by reducing its input or reference voltage after charging the filter capacitor during start-up. However these and other known approaches have various drawbacks including CP gain dependency on voltage step and tendency of the voltage step to propagate through the CP, particularly in programmable CPs. Prior art approaches also do not provide sufficiently precise CP settling and long-term bias voltage stability required for many applications. Thus, there is an ongoing need for improvements in capacitive sensor assemblies and electrical circuits therefor.

BRIEF DESCRIPTION OF THE DRAWINGS

The objects, features and advantages of the present disclosure will become more fully apparent upon consideration of the following detailed description and appended claims in conjunction with the accompanying drawings. The drawings depict only representative embodiments and are not considered to limit the scope of the disclosure.

Those of ordinary skill in the art will appreciate that the figures are illustrated for simplicity and clarity and therefore may not be drawn to scale and may not include well-known features, that the order of occurrence of actions or steps may be different than the order described, that the order of occurrence of such actions or steps may be performed concurrently unless specified otherwise, and that the terms and expressions used herein have meanings understood by those of ordinary skill in the art except where a different meaning is specifically attributed to them herein.

DETAILED DESCRIPTION

The disclosure relates generally to capacitive sensor assemblies having reduced settling time and improved long-term stability of a bias voltage applied to the capacitive transducer, electrical circuits for such sensor assemblies, and methods of operation thereof. Long-term stability means stability of the output voltage after settling. Settling can occur over a time duration on the order of one second (1 sec). Thereafter a bias or output voltage that remains constant within a specified tolerance over a duration of one hour (1 hr) or more is considered stable. The tolerance is application specific and typically specified by the customer and is typically on the order of +/−0.100 volts between 1 s and 1 hr after power up at room temperature.

Figure 1:
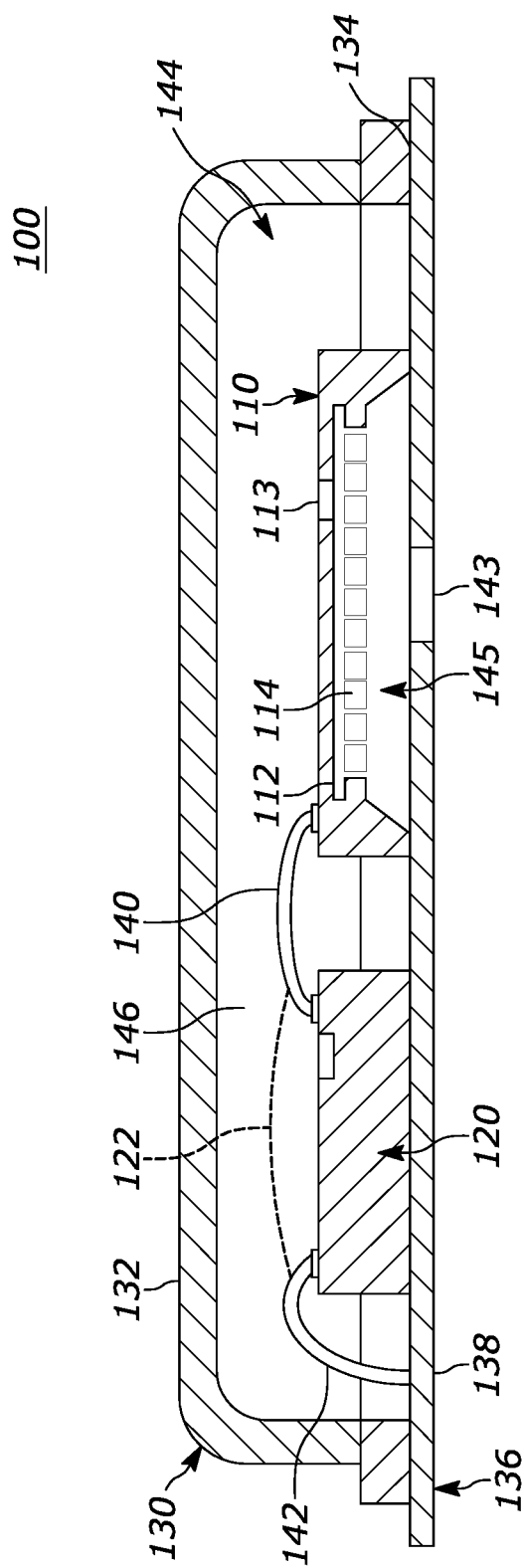
FIG. 1 is a schematic sectional view of a representative sensor assembly.

In FIG. 1, a capacitive sensor assembly 100 comprises a capacitive transduction element (also referred to herein as a "capacitive motor") 110 electrically coupled to an electrical circuit 120 within a housing 130. The capacitive motor can be a microelectromechanical systems (MEMS) motor or some other known or future capacitive transduction element. The representative housing includes a cover 132 fastened to a surface 134 of a base 136. The transduction element and electrical circuit can be fastened to the base, the cover, or one to the cover and the other to the base. In some implementations, the housing shields the transduction element and the electrical circuit located within the interior of the housing from electromagnetic interference, like RF noise. For this purpose, the cover can be a metal or a non-conductive material, like plastic or FR4, comprising a conductive film or other conductive layer electrically coupled to a conductive portion (e.g., a ground plane) of the base. The housing can also include an interface with contacts configured to interface with a host device. Such an interface is also referred to herein as a "host-interface".

The sensor assembly can be configured for mounting to a host device by reflow soldering or via through-hole mounting pins, among other known and future mounting structure and techniques. In FIG. 1, the sensor assembly is a surface-mount device comprising a host-interface (not shown) including electrical contacts (e.g., ground, power, data, clock, select . . . ) located on an outer surface 138 of the base 136. The electrical circuit can obtain power, clock and other signals via contacts on the host-interface as suggested herein. The electrical circuit is coupled to the transduction element via lead 140 and to contacts on the host-interface via one or more leads 142 connected to traces (not shown) in or on the base for this purpose. The electrical circuit can be implemented as an integrated circuit (IC). The IC can be covered by an encapsulating material 122 to reduce thermal effects among other reasons.

In some sensor assemblies, like microphones, the housing includes an aperture (also referred to herein as a "sound port" or "port") connecting the interior of the housing to the external environment. In FIG. 1, the port 143 is located on the base 136 in alignment with the MEMS motor 110. In other sensors, the sound port and in some implementations the transducer can be mounted on some other part of the housing, like the cover or a sidewall. For example, in top-port microphone assemblies, the sound port is located on the cover. A sound port is not required in other sensor assemblies, like acoustic vibration sensors and accelerometers, among others.

In one embodiment, the sensor assembly is a microphone configured to generate an electrical signal representative of acoustic signals, or sounds, propagated through the atmosphere and detected by the transduction element within the housing. In other embodiments, the sensor assembly generates an electrical signal representative of vibrations or forces detected by the transduction element. Such a sensor assembly can detect acoustic vibrations propagated through a person's body or through inanimate objects. Other sensor assemblies detect pressure, acceleration, humidity or temperature, among other environmental conditions. A single sensor assembly can comprise multiple transduction elements to detect different conditions, like sound and vibration, among other combinations. Such transduction elements can be discrete or integrated on a common substrate.

In FIG. 1, the capacitive motor 110 comprises a diaphragm 112 separating an interior 144 of the housing 130 into a front volume 145 and a back volume 146. Sound pressure entering the front volume via sound port 143 displaces the diaphragm resulting in the generation of an electrical signal representative of pressure variations associated with the sound. In FIG. 1, the capacitive motor 110 is coupled to a capacitive sensor interface of the electrical circuit 120 via one or more leads 140. The electrical circuit 120 is coupled to contacts on the host-interface via one or more leads 142 and corresponding traces in the base.

Figure 2:
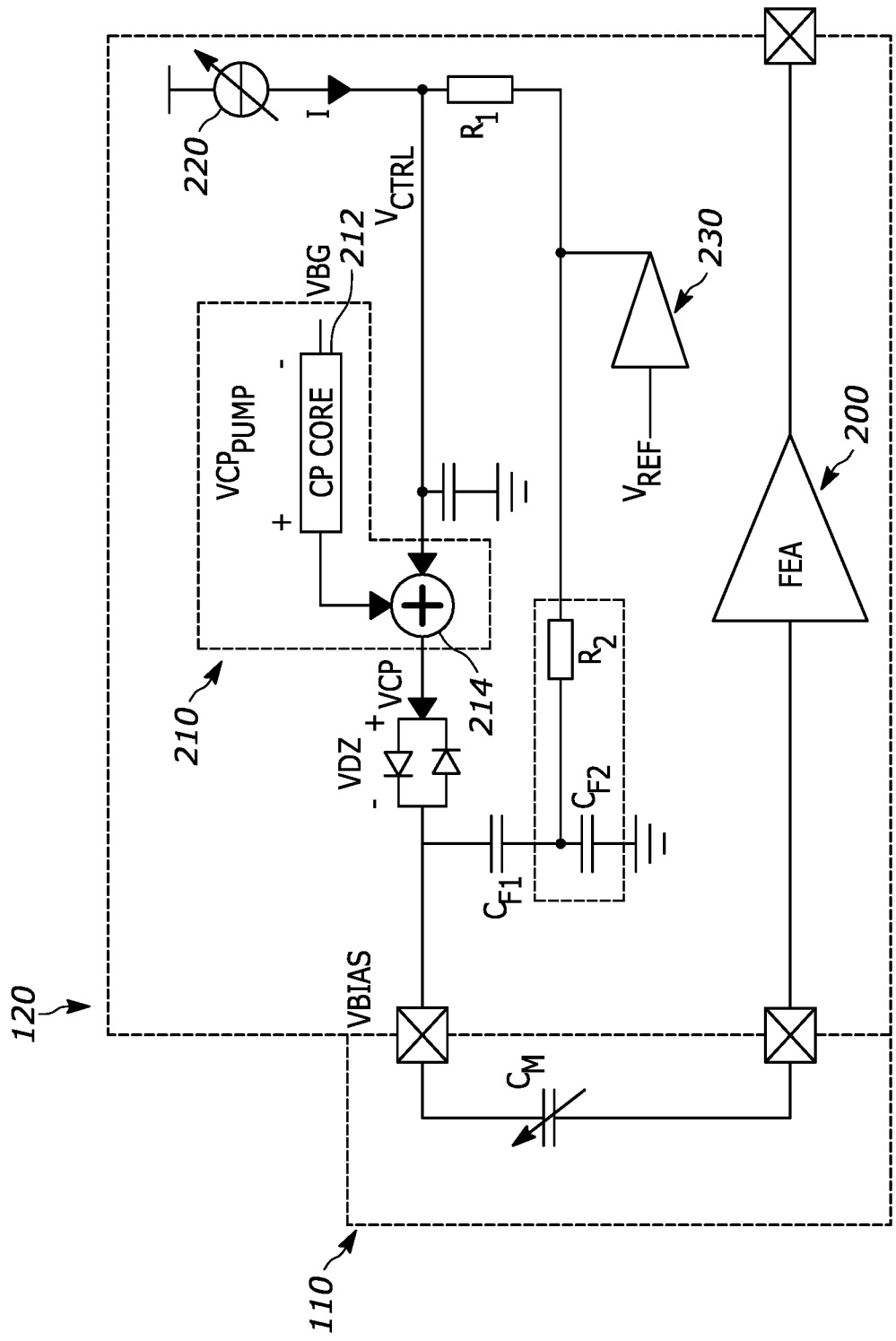
FIG. 2 is a first representative electrical circuit for a sensor assembly.
Figure 3:
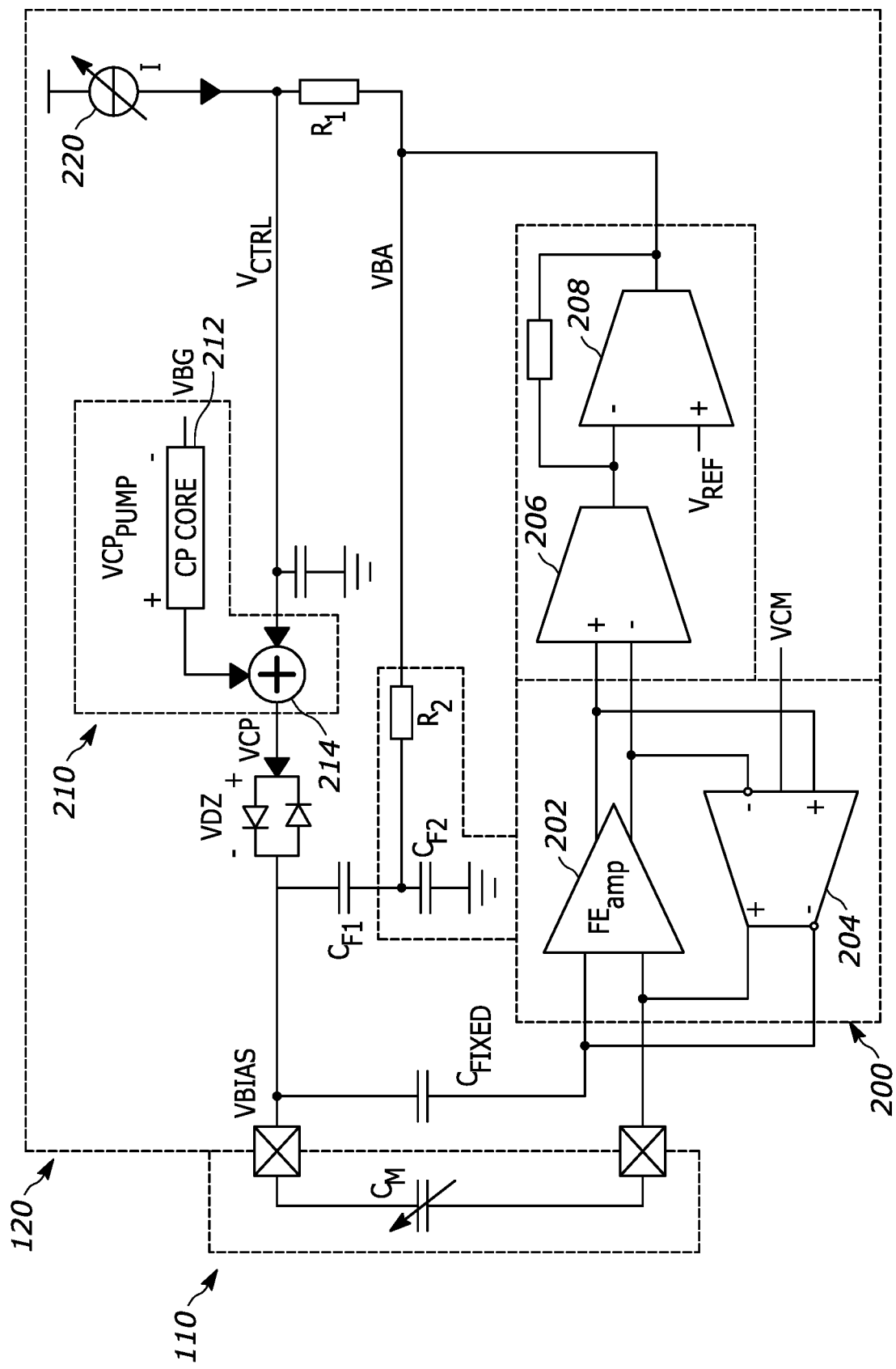
FIG. 3 is a second representative electrical circuit for a sensor assembly.

The electrical circuit generally comprises a charge pump circuit that generates a voltage for biasing the capacitive motor coupled to a capacitive motor interface of the electrical circuit, a low pass filter coupled to the charge pump output and to the capacitive motor interface for filtering the charge pump circuit output voltage applied to the capacitive motor, and an injection current source (ICS) coupled to the charge pump circuit output and configured to control settling during a transient startup phase of the charge pump circuit. The capacitive motor interface generally has an input resistance greater than 100 T ohms, and typically greater than 300 T ohms or more, to prevent charge leakage from the capacitive motor. The electrical circuit also comprises a signal processing circuit comprising a frontend amplifier (FEA) or buffer circuit having an input coupled to the capacitive motor interface and a signal output connectable to the host-interface of the capacitive sensor assembly. In FIGS. 2 and 3, the electrical circuits 120 each comprise a frontend amplifier or buffer circuit 200 described further herein. The signal processing circuit can also comprise other components like an analog-to-digital converter and a signal protocol formatting circuit, among other circuits configured to process the electrical signal produced by the capacitive motor and output the processed signal to the host-device interface.

In FIG. 2, the frontend amplifier or buffer circuit 200 is a single-ended device coupled to the capacitive motor 110 via a capacitive motor interface of the electrical circuit 120. In FIG. 3, frontend amplifier or buffer circuit 200 is a differential device 202 comprising a first differential input coupled to an output of a single-ended capacitive motor $C_M$ and a second differential input coupled to a fixed capacitor $C_{FIXED}$, wherein the differential amplifier operates in a pseudo-differential mode. The fixed capacitor $C_{FIXED}$ can have substantially the same capacitance as the single-ended capacitive motor $C_M$. Alternatively, the differential inputs of the differential amplifier of FIG. 3 can be coupled to differential outputs of a differential capacitive motor (known in the art, but not shown) wherein the differential amplifier operates in a differential mode.

The charge pump circuit can comprise one or more voltage multiplier stages that generate an output voltage based on a reference current or voltage, like a band gap voltage (VBG) or some other reference. In FIGS. 2 and 3, the electrical circuits 120 each comprise a charge pump circuit 210 comprising a multi-stage core 212 that generates a voltage based on a VBG reference. A summer or other voltage additive circuit element 214 combines the output of the charge pump core with another voltage at a charge pump circuit output (VCP) as described further herein. The charge pump circuit output voltage (VCP) can be fixed. Alternatively, the charge pump circuit output voltage (VCP) can be controlled by a programmable reference voltage (e.g., VBG) or by enabling a number of active charge pump stages.

The low pass filter comprises a diode-based resistive element coupled between the charge pump circuit output and a filter capacitor. The diode-based resistive element can be implemented with anti-parallel diodes, bipolar diodes, diode-connected MOS transistors or a single diode, among other circuit elements. An output at a bias voltage node between the diode-based resistive element and the filter capacitor is coupled directly or indirectly to the capacitive motor interface of the electrical circuit. In FIGS. 2 and 3, the electrical circuits 120 each comprise a low pass filter circuit comprising anti-parallel diode based resistive elements (VDZ) and a filter capacitor $C_{F1}$. A bias voltage node ($V_{BIAS}$) is connected to a pad on the capacitive motor interface of the electrical circuit for coupling to the capacitive motor $C_M$, for example, a MEMS motor. In microphone sensor assemblies, a cutoff frequency of the low pass filter is on the order of 1 Hz or less than 1 Hz. Alternatively, the cutoff frequency can be higher depending on the requirements of the application.

The electrical circuit also generally comprises an injection current source (ICS) coupled to the charge pump circuit output and configured to control voltage across the diode-based resistive element during a transient startup phase of the charge pump circuit. In FIGS. 2 and 3, the electrical circuits 120 each comprise an ICS 220 coupled to the charge pump circuit output (VCP) via the summer circuit 214. The ICS can control (e.g., increase or decrease) the voltage on the charge pump circuit output VCP by controlling (e.g., increasing or decreasing) the current (I) as described further herein. In one implementation, the injection current source is a trimmable multi-bit current source.

In FIG. 2, the injection current source (ICS) 220 is coupled to a resistance element R1 connected to a voltage reference source 230, which can be a fixed or variable DC voltage source. The voltage reference source is also coupled to the bias voltage node ($V_{BIAS}$). The voltage reference source can, optionally, be coupled to the bias voltage node ($V_{BIAS}$) by a second low pass filter comprising a resistance element R2 and a filter capacitor $C_{F2}$. The second low pass filter reduces clock and other noise that would otherwise propagate to the bias voltage node $V_{BIAS}$. In microphone sensor assemblies, the cutoff frequency of the second low pass filter is generally above the audio band and can be on the order of 100 kHz. According to this implementation, the ICS can control voltage ($V_{CTRL}$) applied to the summer circuit 214 and thus the voltage on the charge pump circuit output (VCP) by increasing or decreasing voltage dropped across the resistance element R1. The voltage dropped across the resistance element R1 can be increased by increasing ICS current, and the voltage dropped across the resistance element R1 can be decreased by decreasing ICS current or by reversing the ICS current.

In one implementation of the electrical circuit 120 of FIG. 2, the injection current source (ICS) 220 is configured to increase voltage on the charge pump circuit output (VCP) during the transient startup phase of the charge pump circuit and, after a specified duration of the transient startup phase, decrease voltage on the charge pump output (VCP) relative to the voltage on the bias voltage node ($V_{BIAS}$) while the voltage of the voltage reference source 230 is fixed. The fixed voltage reference can be ground or some other fixed reference voltage. The ICS can be configured to decrease voltage on the charge pump circuit output (VCP) by applying a negative step voltage to the summer circuit 214.

In another implementation of the electrical circuit 120 of FIG. 2, the injection current source (ICS) 220 is configured to reduce voltage across the diode-based resistive element during application of an increased voltage to the bias voltage node ($V_{BIAS}$) after a specified duration of the transient startup phase. In one implementation, the ICS maintains voltage on the charge pump circuit output (VCP) during application of the increased voltage to the bias voltage node ($V_{BIAS}$). The voltage applied to the bias voltage node ($V_{BIAS}$) can be increased by increasing the $V_{REF}$ voltage of the voltage reference source 230. The voltage reference source can be configured to increase voltage on the bias voltage node ($V_{BIAS}$) by applying a positive step voltage to the bias voltage node ($V_{BIAS}$). In this implementation, the ICS is configured to sink current from the resistance element R1 to compensate for the tendency of the increased $V_{REF}$ voltage to increase voltage applied to the summer circuit 214.

In some electrical circuits, the frontend amplifier is a differential amplifier coupled to the input of a balance amplifier circuit having a single-ended output coupled to the charge pump circuit output and to the bias voltage node. In FIG. 3, the frontend differential amplifier 202 comprises differential inputs. Optionally, the differential amplifier can be stabilized by a DC servo-loop 204. The balance amplifier comprises an amplifier 206 having differential inputs coupled to the differential outputs of the differential amplifier 202. An output of the amplifier 206 can be coupled to a trans-impedance amplifier (TIA) 208 having a single-ended output coupled to a resistance element R1 and to the bias voltage node ($V_{BIAS}$). Alternatively, the single-ended output of the amplifier 206 can be coupled directly to the bias voltage node ($V_{BIAS}$) without the TIA 208. The injection current source (ICS) 220 is coupled to the resistance element R1 opposite the balance amplifier. According to this implementation, the ICS can control voltage ($V_{CTRL}$) applied to the summer circuit 214 and thus the voltage on the charge pump circuit output (VCP) by increasing or decreasing voltage dropped across the resistance element R1. The voltage dropped across the resistance element R1 can be increased by increasing the ICS current, and the voltage dropped across resistance element R1 can be decreased by decreasing ICS current or by reversing the ICS current. The single-ended output of the balance amplifier circuit can, optionally, be coupled to the bias voltage node ($V_{BIAS}$) by a second low pass filter comprising a resistance element R2 and a filter capacitor $C_{F2}$. The second low pass filter reduces clock and other noise that would otherwise propagate to the bias voltage node $V_{BIAS}$. In microphone sensor assemblies, the cutoff frequency of the second low pass filter is above the audio band and can be on the order of 100 KHz.

In one implementation of the electrical circuit 120 of FIG. 3, the injection current source (ICS) 220 is configured to increase voltage on the charge pump circuit output (VCP) during the transient startup phase and, after a specified duration of the transient startup phase, decrease voltage on the charge pump circuit output (VCP) relative to the voltage on the bias voltage node ($V_{BIAS}$). The ICS can be configured to decrease voltage on the charge pump circuit output (VCP) after the specified duration by applying a negative step voltage to the summer element 214.

In another implementation of the electrical circuit of FIG. 3, the injection current source (ICS) 220 is configured to reduce voltage across the diode-based resistive element while the balance amplifier increases voltage on the bias voltage node ($V_{BIAS}$) after a specified duration of the transient startup phase. In one implementation, the ICS maintains voltage on the charge pump circuit output (VCP) during application of the increased voltage to the bias voltage node ($V_{BIAS}$). The voltage on the bias voltage node ($V_{BIAS}$) can be increased by increasing the $V_{REF}$ voltage of the TIA 208. The TIA can be configured to increase voltage on the bias voltage node ($V_{BIAS}$) by applying a positive step voltage to the bias voltage node ($V_{BIAS}$). In this implementation, the ICS is configured to sink current from resistance element R1 to compensate for the tendency of the increased voltage ($V_{REF}$) to increase voltage applied to the summer circuit 214.

Figure 4:
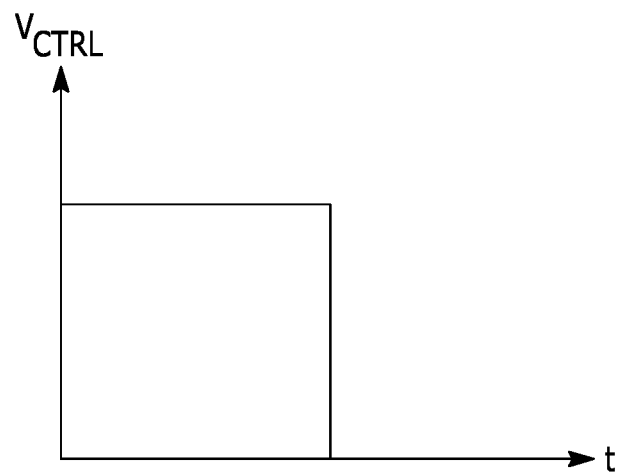
FIG. 4 is a first control signal produced by the injection current source of FIGS. 2 and 3.

FIG. 4 shows a representative voltage ($V_{CTRL}$) applied to the summer circuit 214 in FIGS. 2 and 3 during the transient startup phase and, after the specified duration, the application of a negative step to reduce the voltage ($V_{CTRL}$). After the specified duration, the voltage on the charge pump output (VCP) is stepped down under control of the injection current source (ICS). The voltage on the charge pump output (VCP) can be efficiently controlled by turning ON the ICS during the initial transient startup phase and subsequently turning OFF the ICS after the specified duration. Alternatively, the ICS can be operated continuously after the voltage $V_{CTRL}$ is reduced relative to some higher voltage level. The increased voltage on the charge pump circuit output (VCP) relative to the voltage on the bias voltage node ($V_{BIAS}$) during the transient startup phase and the subsequent voltage step down on VCP reduces settling time by accelerating the charging of the filter capacitor $C_{F1}$ without the undesirable effects associated with prior art settling time reduction schemes.

Figure 5:
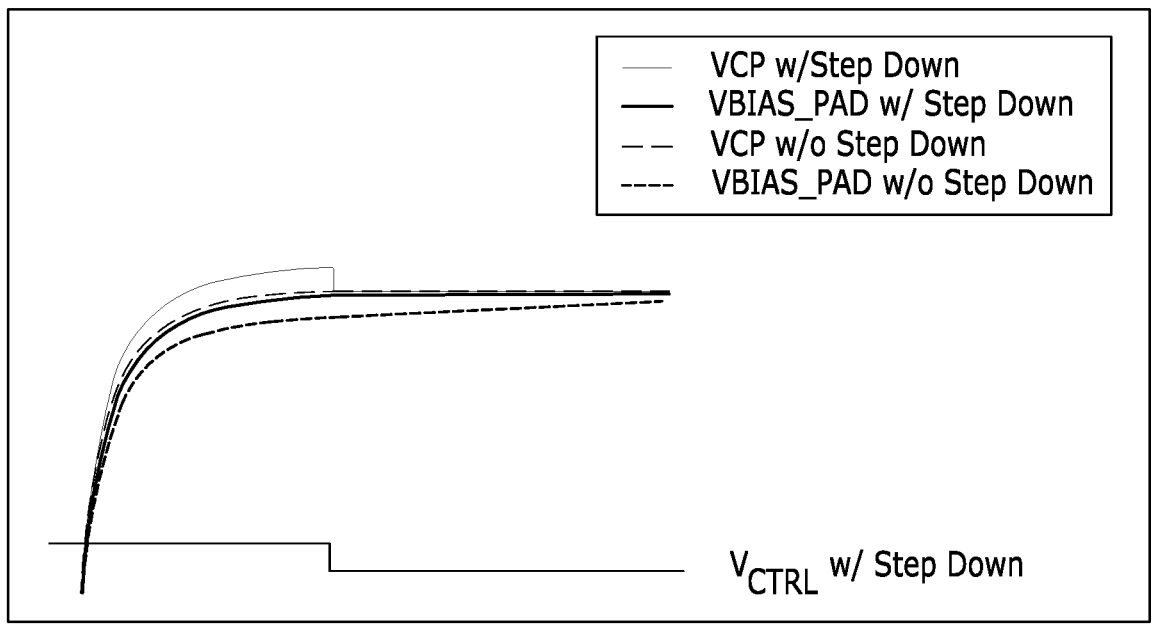
FIG. 5 illustrates plots of voltage on the charge pump circuit output and voltage on the bias voltage node with and without settling time reduction according to implementations based on the first control signal.

The plots of FIG. 5 illustrate voltage on the charge pump circuit output (VCP) and voltage on the bias voltage node ($V_{BIAS}$) at the capacitive motor interface (PAD) with and without settling time reduction as described herein. FIG. 5 illustrates that reduced settling time can be achieved by increasing the voltage on the charge pump circuit output (VCP) during the transient startup phase and, after a specified duration of the transient startup phase, stepping down the voltage on the charge pump circuit output (VCP) with the injection current source.

Figure 6:
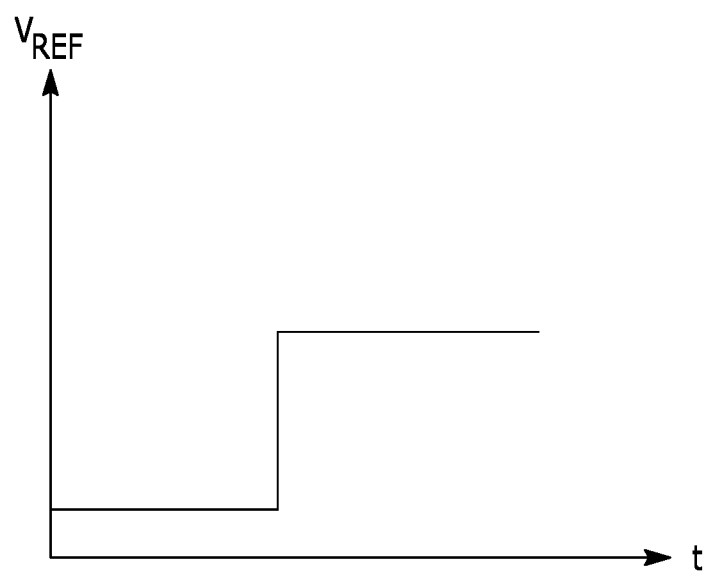
FIG. 6 is a second control signal produced by a balance amplifier or other voltage reference of FIGS. 3 and 4.

FIG. 6 shows a representative reference voltage ($V_{REF}$) applied to the bias voltage node ($V_{BIAS}$) in FIGS. 2 and 3 during the transient startup phase after the specified duration of the transient startup phase. After the specified duration, the voltage on the bias voltage node ($V_{BIAS}$) is increased relative to the voltage on the charge pump circuit output (VCP) by a step up of the reference voltage ($V_{REF}$) relative to a base line voltage. The injection current source (ICS) maintains or reduces the voltage on the charge pump circuit output (VCP) relative to the stepped up voltage on the bias voltage node ($V_{BIAS}$) as described herein. The decreased voltage on the charge pump circuit output (VCP) relative to the voltage on the bias voltage node ($V_{BIAS}$) resulting from the positive step after the specified duration of the transient startup phase reduces settling time by accelerating the charging of the filter capacitor $C_{F1}$ without the undesirable effects associated with prior art settling time reduction schemes.

Figure 7:
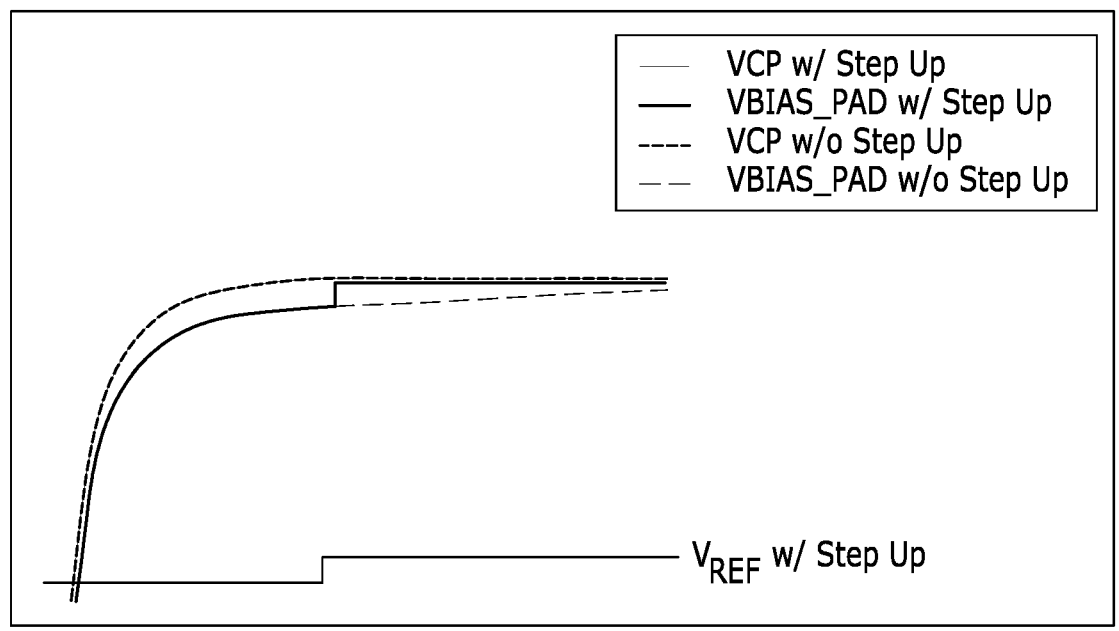
FIG. 7 illustrates plots of voltage on the charge pump circuit output and voltage on the bias voltage node with and without settling time reduction according to implementations based on the second control signal.

The plots of FIG. 7 illustrate voltage on the charge pump circuit output (VCP) and voltage on the bias voltage node ($V_{BIAS}$) at the capacitive motor interface (PAD) with and without settling time reduction as described herein. FIG. 7 illustrates that reduced settling time can be achieved by increasing the voltage on the bias voltage node ($V_{BIAS}$) after a specified duration of the transient startup phase while the injection current source maintains the voltage on the charge pump circuit output (VCP).

While the disclosure and what is presently considered to be the best mode thereof has been described in a manner establishing possession and enabling those of ordinary skill in the art to make and use the same, it will be understood and appreciated that there are many equivalents to the representative embodiments described herein and that myriad modifications and variations may be made thereto without departing from the scope and spirit of the invention, which is to be limited not by the embodiments described but by the appended claims and their equivalents.

What is claimed is:

1. An electrical circuit for a capacitive sensor assembly, the electrical circuit comprising:
   a capacitive motor interface having an input resistance greater than 100 T ohms, the capacitive motor interface connectable to a capacitive motor;
   a charge pump circuit comprising an output (VCP) and reference signal input that controls a voltage on the output;
   a low pass filter comprising diode-based resistive element (VDZ) coupled between the charge pump circuit output (VCP) and a filter capacitor, a bias voltage node (Vbias) between the diode-based resistive element (VDZ) and the filter capacitor, the bias voltage node (Vbias) coupled to the capacitive motor interface;
   a frontend amplifier circuit having an input coupled to the capacitive motor interface and an output coupled to an output of the electrical circuit;
   an injection current source (ICS) coupled to the charge pump circuit output (VCP) and configured to control voltage across the diode-based resistive element (VDZ) during a transient startup phase of the charge pump circuit.

2. The electrical circuit of claim 1, the injection current source configured to increase voltage on the charge pump circuit output (VCP) during the transient startup phase and, after a specified duration of the transient startup phase, apply a negative step voltage on the charge pump circuit output (VCP), wherein a settling time of the low pass filter is reduced.

3. The electrical circuit of claim 1, the injection current source is configured to reduce voltage across the diode-based resistive element during application of a positive step voltage to the bias voltage node (VBIAS) after a specified duration of the transient startup phase, wherein a settling time of the low pass filter is reduced.

4. The electrical circuit of claim 1 further comprising a balance amplifier circuit having an input coupled to a differential output of the frontend amplifier circuit, the balance amplifier circuit having a single-ended output coupled to the charge pump circuit output (VCP), the single-ended output of the balance amplifier coupled to the bias voltage node (Vbias).

5. The electrical circuit of claim 4, wherein the injection current source is configured to increase voltage on the charge pump circuit output (VCP) during the transient startup phase and, after a specified duration of the transient startup phase, decrease voltage on the charge pump circuit output (VCP), wherein a settling time of the low pass filter is reduced.

6. The electrical circuit of claim 5, wherein the injection current source is configured to decrease voltage on the charge pump circuit output (VCP) by applying a negative step voltage to the charge pump circuit output (VCP).

7. The electrical circuit of claim 4, the injection current source is configured to reduce voltage across the diode-based resistive element while the balance amplifier increases voltage on the bias voltage node (VBIAS) after a specified duration of the transient startup phase, wherein a settling time of the low pass filter is reduced.

8. The electrical circuit of claim 7, wherein the balance amplifier is configured to increase voltage on the bias voltage node ($V_{BIAS}$) by outputting a positive step voltage.

9. The electrical circuit of claim 4, wherein the injection current source is a trimmable multi-bit current source.

10. The electrical circuit of claim 4 further comprising a second low pass filter coupling the single-ended output of the balance amplifier circuit to the bias voltage node (Vbias).

11. The electrical circuit of claim 4 further comprising a fixed capacitor coupled to a first differential input of the frontend amplifier circuit, wherein the frontend amplifier circuit is configured in a pseudo-differential mode when a single-ended capacitive motor is connected to a second differential input of the frontend amplifier circuit.

12. The electrical circuit of claim 1 is an integrated circuit in combination with a microelectromechanical systems (MEMS) capacitive motor connected to the capacitive motor interface, and the charge pump circuit is programmable.

13. A capacitive sensor assembly comprising:
   a housing comprising a host-interface including contacts;
   a capacitive motor disposed in the housing;
   an electrical circuit disposed in the housing and electrically connected to contacts of the host-interface, the electrical circuit comprising:
      a charge pump circuit comprising an output (VCP);
      a low pass filter comprising diode-based resistive element (VDZ) coupled between the charge pump circuit output (VCP) and a filter capacitor, a bias voltage node (Vbias), located between the diode-based resistive element (VDZ) and the filter capacitor, electrically coupled to the capacitive motor;
      a frontend amplifier circuit having an input coupled to the capacitive motor and an output coupled to an output of the electrical circuit;
      a balance amplifier circuit having an input coupled to a differential output of the frontend amplifier circuit, the balance amplifier circuit having a single-ended output coupled to the charge pump circuit output (VCP) and to the bias voltage node (Vbias);
      an injection current source (ICS) coupled to the charge pump circuit output (VCP) and configured to control voltage across the diode-based resistive element (VDZ) during a transient startup phase of the charge pump circuit.

14. The capacitive sensor assembly of claim 13, the injection current source configured to reduce voltage on the charge pump circuit output (VCP) after a specified duration of the transient startup phase, wherein a settling time of the low pass filter is reduced.

15. The capacitive sensor assembly of claim 14, the filter capacitor comprising a capacitance on the order of 10 pF, wherein the injection current source is configurable to increase the voltage on the charge pump circuit output (VCP) by as much as 300 mV during the transient startup phase before applying a negative voltage step.

16. The capacitive sensor assembly of claim 13, the injection current source configured to reduce voltage across the diode-based resistive element after a specified duration of the transient startup phase while the balance amplifier increases a reference voltage on the single-ended output, wherein a settling time of the low pass filter is reduced.

17. The capacitive sensor assembly of claim 13 further comprising a second low pass filter coupling the single-ended output of the balance amplifier circuit to the bias voltage node (Vbias).

18. The capacitive sensor assembly of claim 17 is a microphone, wherein a cutoff frequency of the low pass filter is on the order of 1 Hz or less and the cutoff frequency of the second low pass filter is on the order of 100 KHz.

19. The capacitive sensor assembly of claim 13, wherein the capacitive motor is a differential microelectromechanical systems (MEMS) motor coupled to a differential input of the frontend amplifier circuit.

20. The capacitive sensor assembly of claim 13, the electrical circuit further comprising a fixed capacitor coupled to a first differential input of the frontend amplifier circuit, and the capacitive motor is a single-ended microelectromechanical systems (MEMS) motor coupled to a second differential input of the frontend amplifier circuit, wherein the frontend amplifier circuit is configured in a pseudo-differential mode.

* * * * *